United States Patent [19]

Malhi et al.

[11] Patent Number: 5,111,260
[45] Date of Patent: May 5, 1992

[54] POLYSILICON FETS

[75] Inventors: Satwinder Malhi, Richardson; Rajiv Shah, Plano, both of Tex.

[73] Assignee: Texax Instruments Incorporated, Dallas, Tex.

[21] Appl. No.: 548,168

[22] Filed: Jul. 5, 1990

Related U.S. Application Data

[60] Division of Ser. No. 805,270, Dec. 6, 1985, abandoned, which is a continuation of Ser. No. 505,156, Jun. 17, 1983, abandoned.

[51] Int. Cl.$^5$ ............................................. H01L 29/78
[52] U.S. Cl. ...................................... 357/23.7; 357/2; 357/4; 357/59; 430/319
[58] Field of Search ................. 357/2, 4, 23.7, 59 F, 357/59 E; 430/319

[56] References Cited

U.S. PATENT DOCUMENTS

| 3,500,137 | 3/1970 | Schroen et al. | 357/23.7 |
| 3,814,992 | 6/1974 | Kump | 357/23.12 |
| 3,891,468 | 6/1975 | Ito et al. | 357/23 D |
| 3,958,266 | 5/1976 | Athanas | 357/23.7 |
| 4,072,974 | 2/1978 | Ipri | 357/23 TF |
| 4,389,481 | 6/1983 | Poleshuk et al. | 430/319 |
| 4,395,726 | 7/1983 | Maegushi | 357/23 TF |

FOREIGN PATENT DOCUMENTS

| 0061923 | 6/1982 | European Pat. Off. | |
| 0073603 | 9/1983 | European Pat. Off. | |
| 52-48475 | 4/1977 | Japan | 357/23.7 |
| 55-65472 | 5/1980 | Japan | 357/23.7 |
| 58-4974 | 1/1983 | Japan | 357/23.7 |

OTHER PUBLICATIONS

Applied Physics Letters, vol. 36, #7, Apr. 1, 1980, "Enhanced Conductivity in Plasma Hydrogenated Polysilicon Films", by D. R. Campbell.
IEEE Transactions on Electron Devices, vol. #12, Dec. 1966, "Thin Film SOS Deep Depletion MOS Transistors", by Heiman.
Electron Device Letters, ELD-1, pp. 117-118, 1980, by Gibbons.
IEEE Transactions on Electron Devices, ED-29, pp. 585-589, 1982 by Colinge.
IEDM Technical Digest, pp. 370-373, 1979, by Fizuha et al.
IEDM Technical Digest, 1978, pp. 360-363, by Oboyone.
IEEE Journal of Solid State Circuits, SC-17, pp. 799-803, 1982, by Oochii.
IEEE Journal of Solid State Circuits, SC-17, pp. 804-809, 1982, by Ochida.
IEEE Transactions on Electron Devices, ED-26, pp. 2-9, 1979, by May.
IEEE Electron Device Letters, vol. 4, #10, Oct. 1983, "P Channel MOSFET in LPCVD Polysilicon", by Malhi, pp. 369-371.
Applied Physics Letters, vol. 42, #8, Apr. 1983, "Polysilicon Si Thin Film Transistor", by Hirai, pp. 701-703.
Solid State Electronics, vol. 24, #11, Nov. 1981, by Lee, "The Field Effect Electron Mob . . . in Poly Si", pp. 1059-1066.
IEEE Electron Device Letters, vol. 1, #8, Aug. 1980, "Hydrogenation of FET in Poly Si Films", pp. 159-161.
Appl. Phys. Lett. 42(8), Apr. 15, 1983, "Glow Discharge Polycrystalline Silicon Thin-Film Transistors", by Hirai et al., pp. 701-703.
Journal of Applied Physics, vol. 46, No. 12, Dec. 1975, "The Electrical Properties of Polycrystalline Silicon Films", by Seto, pp. 5247-5254.

*Primary Examiner*—Rolf Hille
*Assistant Examiner*—Steven Loke
*Attorney, Agent, or Firm*—Melvin Sharp; James T. Comfort; N. Rhys Merrett

[57] ABSTRACT

Field effect transistors in which the channel region is made of thin highly doped polysilicon which is preferably also hydrogen passivated.

5 Claims, 10 Drawing Sheets

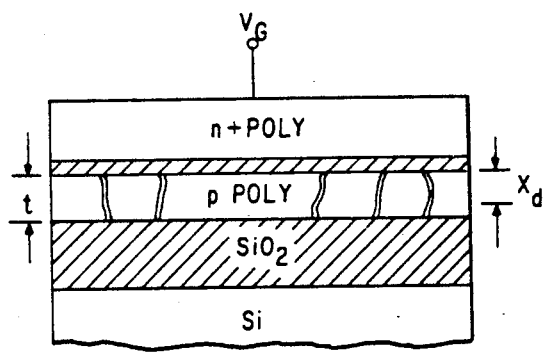

INCREASING $N_A$ PRODUCES:

1) DECREASING $V_T$
2) INCREASING $I_D$
3) DECREASING $X_d$ $$V_T = \phi_{MS} + 2\phi_F + \frac{Q_f}{C_0} + \frac{Q_D}{C_0}$$

TO PREVENT LEAKAGE:

1) $t \leq X_d$
   USE THIN CHANNEL POLY
   $1000 \text{Å} < t \leq 1500 \text{Å}$ $$= -0.9 + 0.7 - 2.3 + \frac{Q_D}{C_0}$$

$$= -2.5 + \frac{qN_A}{C_0} \times X_d$$

THIN CHANNEL POLY PRODUCES:

1) LARGE DRIVE CURRENT
2) LOW LEAKAGE CURRENT
3) SMALL VERTICAL STEP $$= -2.5 + \frac{qN_A}{C_0} \left(\frac{4\epsilon_S \phi_F}{qN_A}\right)^{1/2}$$

$$= -2.5 + \frac{(4\epsilon_S \phi_F qN_A)^{1/2}}{C_0}$$

Fig. 1

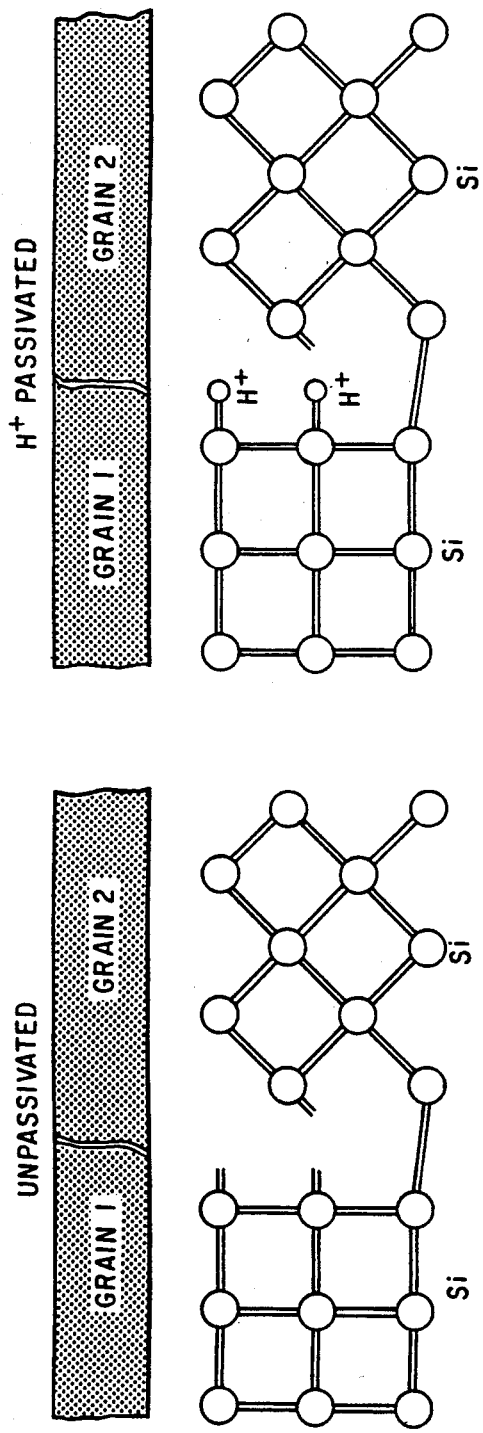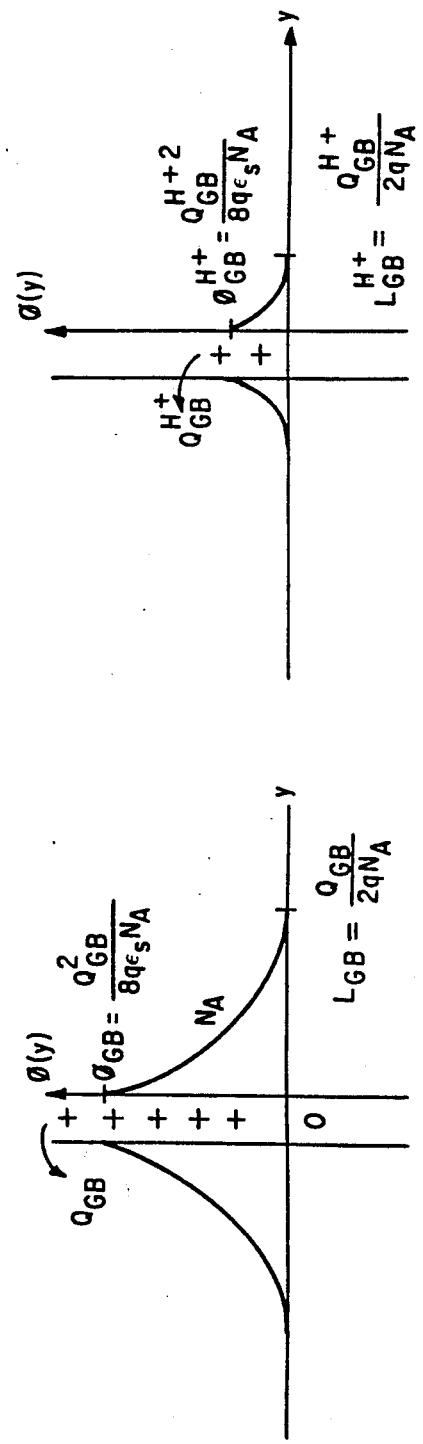
Fig. 2b
Fig. 2a

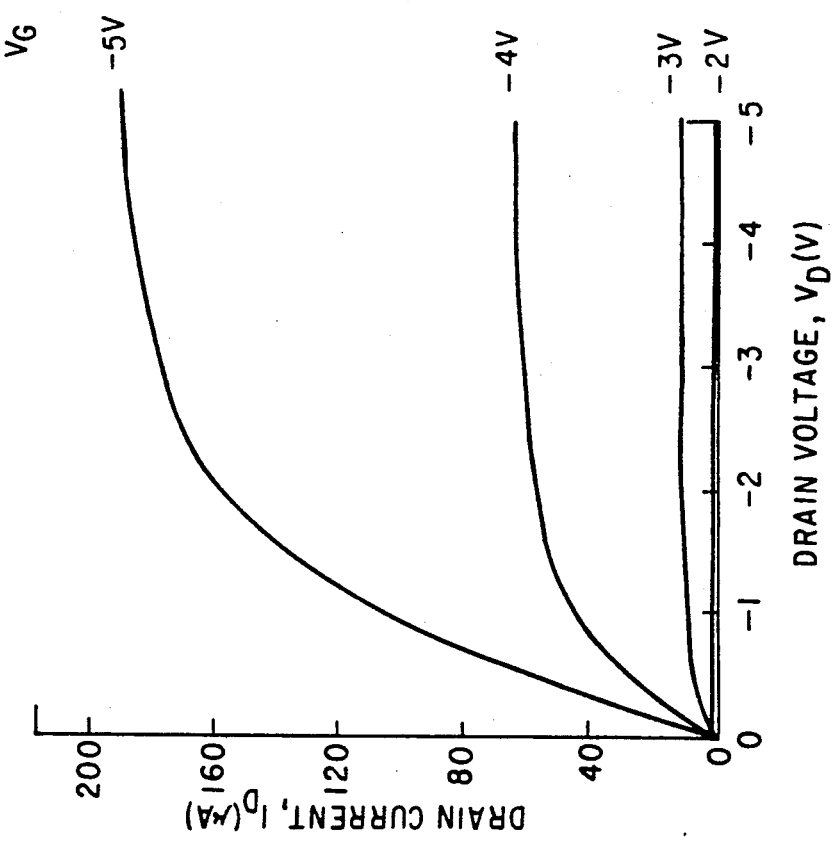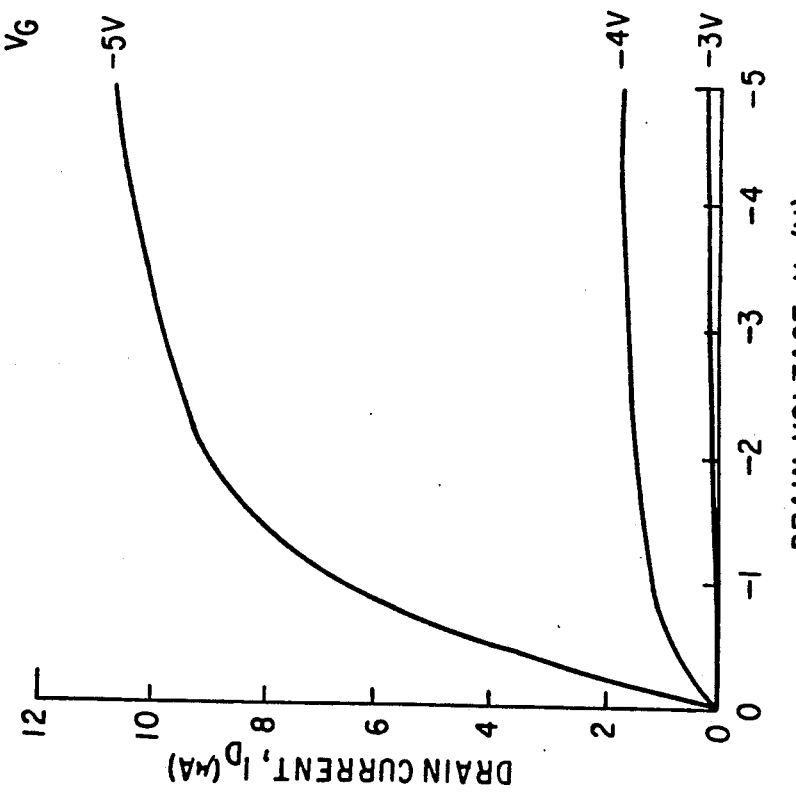

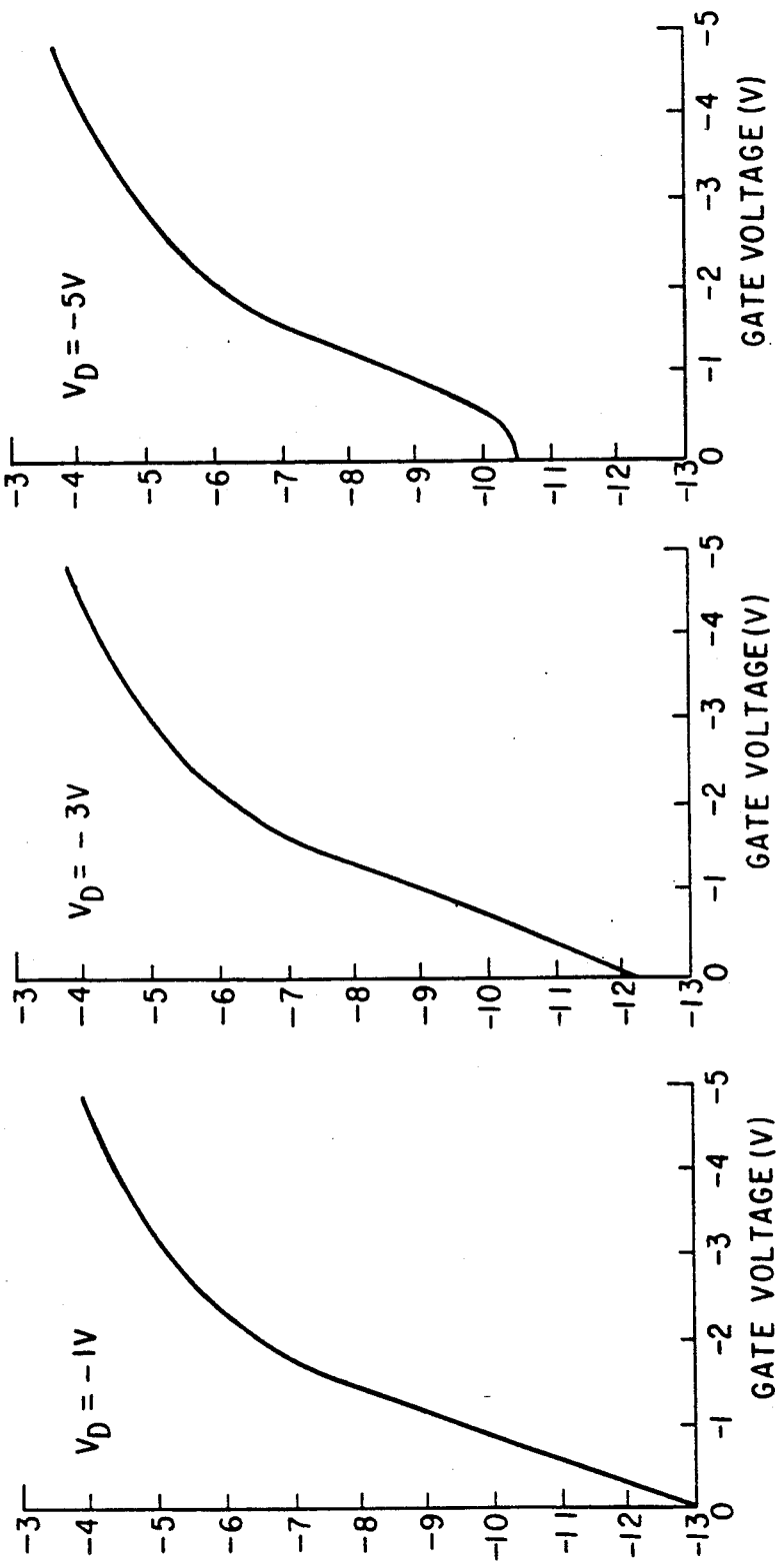

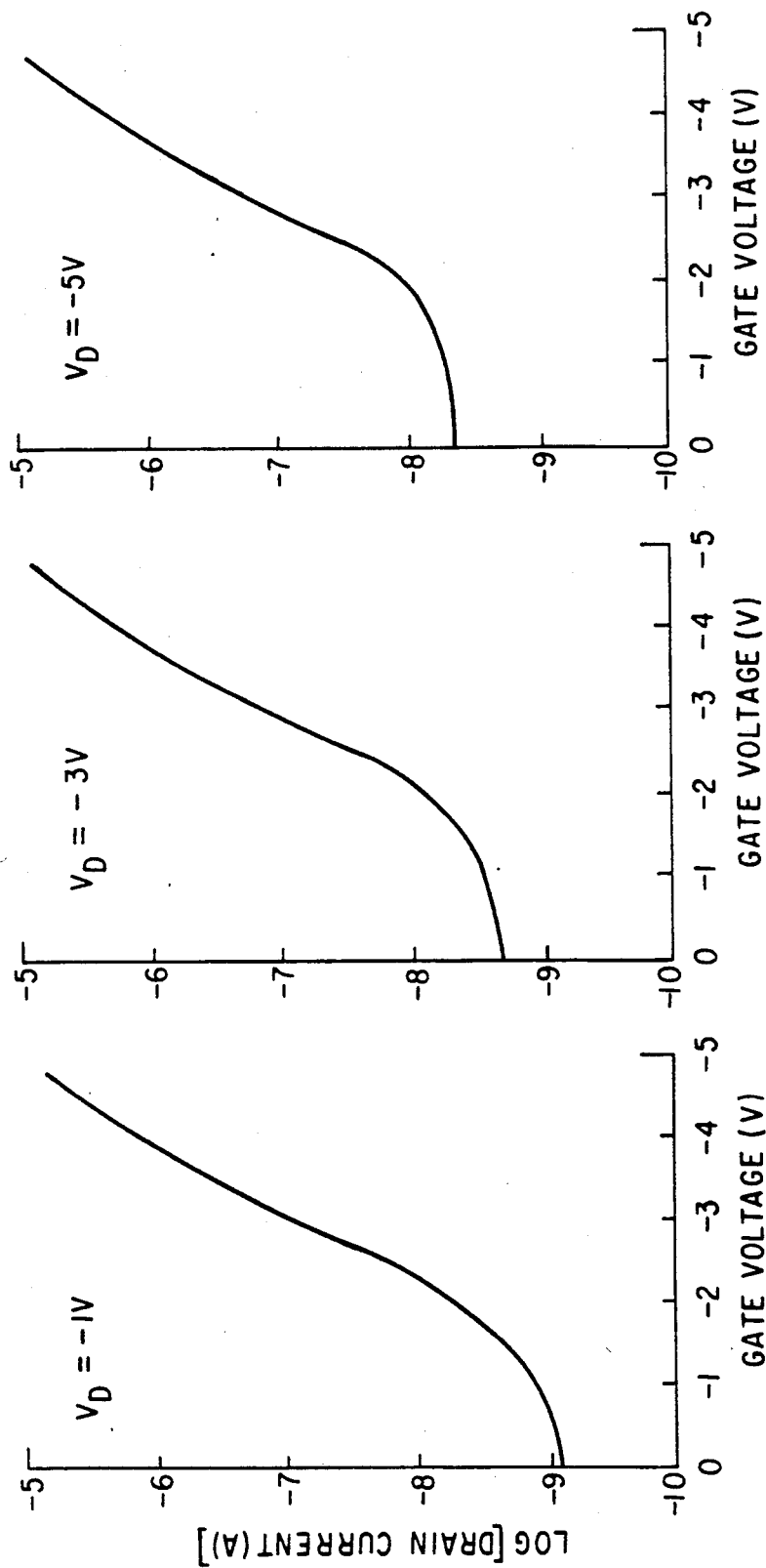

POLYSILICON FETS

This is a division of application Ser. No. 805,270 filed Dec. 6, 1985, now abandoned, which is a continuation of Ser. No. 06/505,156, Jun. 17, 1983, now abandoned.

BACKGROUND AND SUMMARY OF THE INVENTION

The present invention relates to field effect transistors and to integrated circuits.

For numerous applications, it would be desirable to be able to fabricate good quality field effect transistors in polycrystalline semiconductor material. Such a capability would lead to breakthroughs in at least two areas. First, silicon on insulator structures could be fabricated on a very wide variety of substrates. At present, silicon on insulator structures can only be used in those cases where a good lattice match between the silicon active device layer and the insulating substrate can be found. Secondly, and perhaps of even more importance, the capability for good quality polysilicon devices permits vertical integration. That is, at present integrated circuits are essentially two-dimensional devices, and active devices cannot be overlaid one on top of another. However, if it were possible to fabricate active devices having polysilicon channels, such active devices could be formed on an insulator layer on too of another active device. This opens the door to a whole new generation of integrated circuit device design.

However, the numerous prior attempts in the art to build transistors in polysilicon have encountered three major difficulties. First, the mobility (and hence the bulk conductivity) of polysilicon material is inherently very low. Second, leakage problems have normally been found with polysilicon transistors. Third, the threshold voltages of such transistors have been extremely large.

These problems are in some respects complementary. That is, by making the channel of a polysilicon transistor very long, the leakage current can be somewhat reduced. However, in this case, the low mobility of the polysilicon means that the device will have a very large series resistance, so that a huge low-gain device is likely to result if one attempts to design a practical polysilicon transistor using methods of the prior art.

Prior art attempts to design a good polysilicon transistor have typically used relatively thick polysilicon (e.g. 3500-7500 Angstroms) at modest doping channel levels of, e.g., $10^{16}$ or less per cubic centimeters, operated in the inversion mode. (I.e., the channel is n-type poly for a PMOS transistor having p+poly sources and drains.) Inversion mode is typically used to reduce leakage current. However, the result of such a device configuration is a very high threshold voltage, typically in the range of eight to ten volts. This is too high for most integrated circuit applications.

The present invention avoids these difficulties, by providing a field effect transistor having a channel region which is a thin (preferably 1000 to 1500 Angstroms) highly doped (preferably $10^{17}$ to $10^{18}$ per cc) polysilicon layer. The channel region is preferably hydrogen annealed, to reduce leakage current. Such a transistor is preferably operated in the accumulation mode. (I.e. the channel is p-type polysilicon for a PMOS device.) The combination of these characteristics results in a transistor which has low leakage current, high source/drain breakdown voltage, low threshold voltage, and low channel series resistance.

Thus, it is an object of the present invention to provide a polysilicon-channel transistor having low leakage.

It is a further object of the present invention to provide a polysilicon-channel transistor having low series resistance.

It is a further object of the present invention to provide a polysilicon-channel transistor having low series resistance and relatively small physical size.

It is a further object of the present invention to provide a field effect transistor having a channel region comprised of polycrystalline material, which has low leakage current.

It is a further object of the present invention to provide a field effect transistor having a channel composed of polycrystalline material, which has low on-state series resistance.

It is a further object of the present invention to provide a polysilicon field effect transistor having a low threshold voltage.

According to the present invention there is provided:

A field effect transistor comprising:

A channel region comprising polycrystalline semiconductor material;

Source and drain regions connected to said channel region; and

A gate positioned to apply an electric field to said channel region between said source and drain regions;

Wherein said channel has an equilibrium carrier concentration of at least five times $10^{16}$ per cubic centimeter.

BRIEF DESCRIPTION OF THE DRAWINGS

The present invention will be described with reference to the accompanying drawings, wherein:

FIG. 1 shows a first conceptual embodiment of the present invention;

FIGS. 2a-2b show the effect of grain boundary passivation on the space charge barriers of the grain boundaries;

FIGS. 7a-b shows the effect of hydrogen passivation on the output iv characteristics of a sample device according to the present invention;

FIGS. 9a-9f show the effect of hydrogen passivation on the subthreshold characteristics of a sample device according to the present invention;

DESCRIPTION OF THE PREFERRED EMBODIMENTS

Figure 3A:
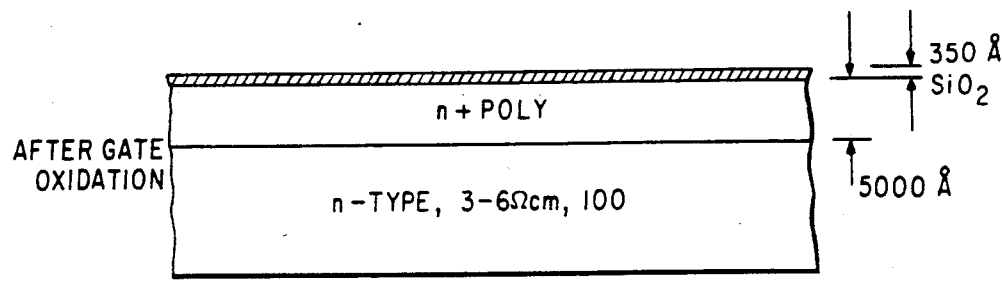
FIGS. 3a-3d show successive stages in the fabrication of another embodiment of the present invention.
Figure 3B:
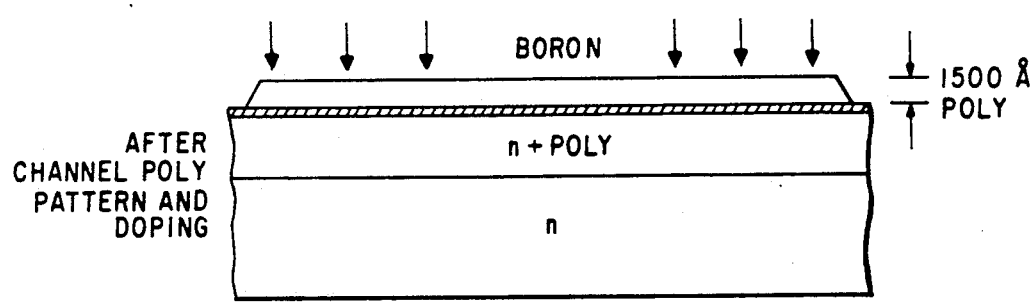
Figure 3C:
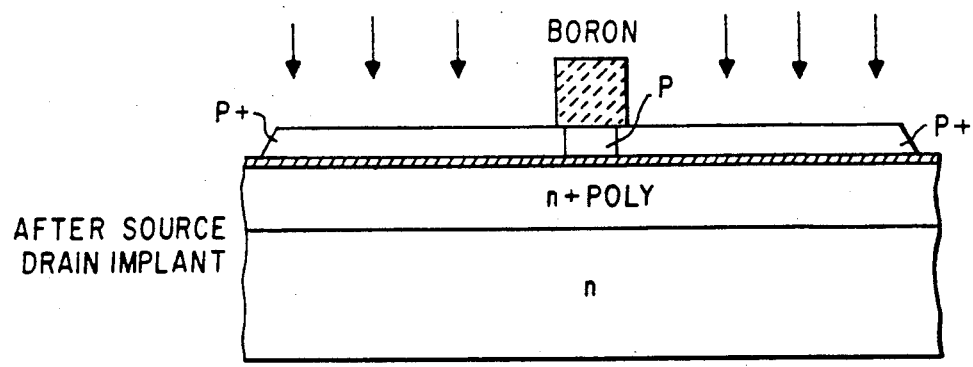
Figure 3D:
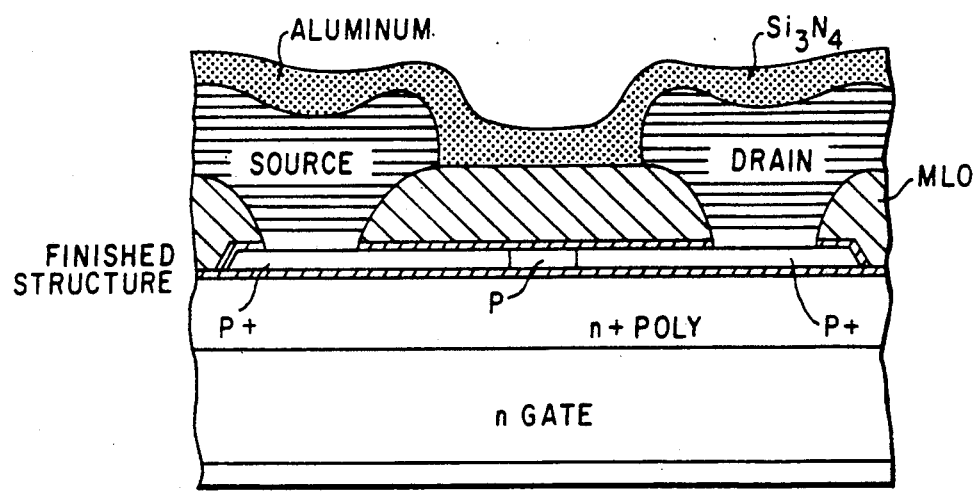
Figure 4:
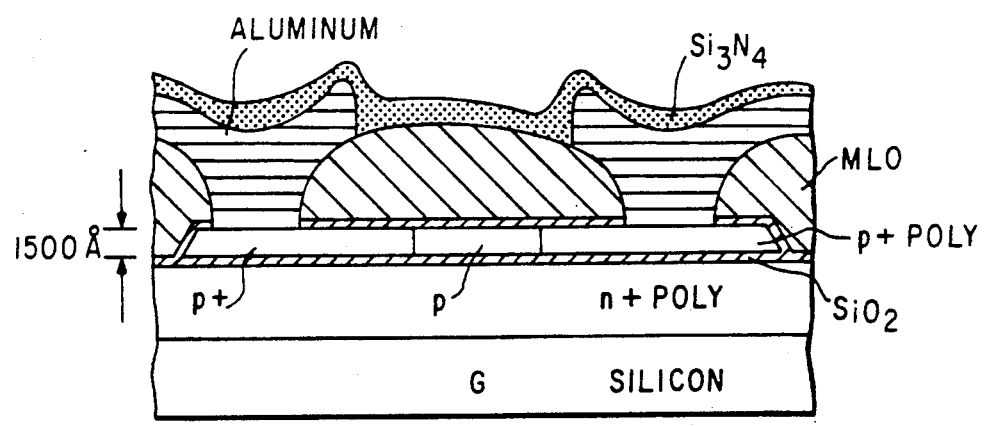
FIGS. 4-6 show further embodiments of the present invention.
Figure 5:
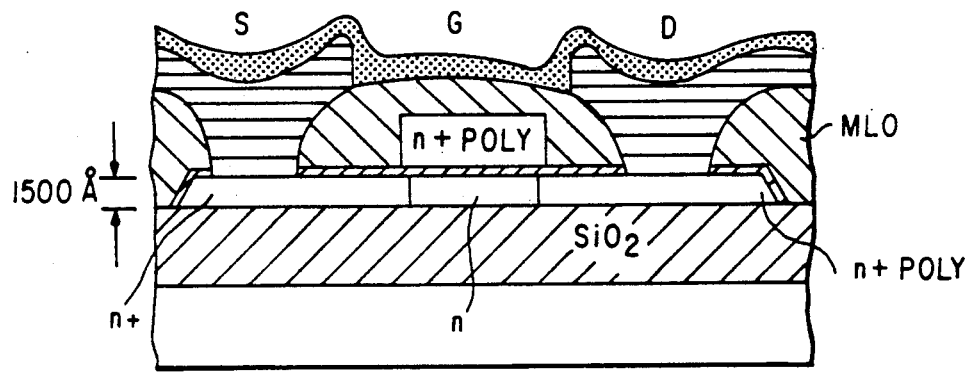
Figure 6:
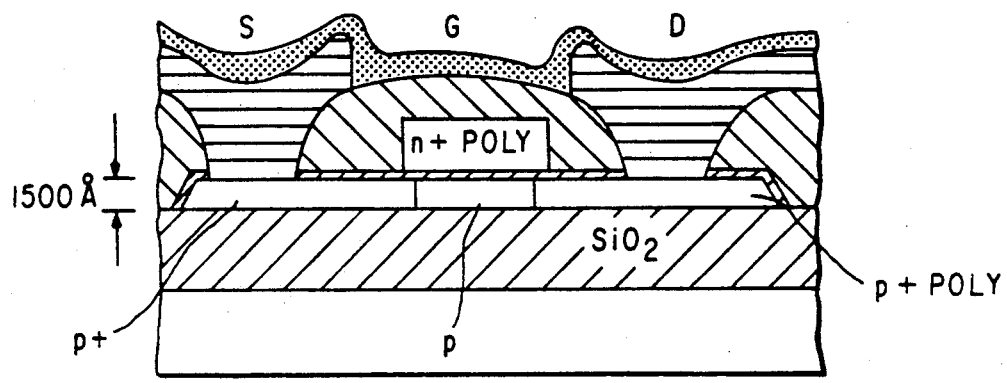

FIG. 3a shows the device structure used to build a first embodiment of the invention. The starting material was 3-6 ohm-cm, (100) , 3" silicon slices. A 5000 A LPCVD polysilicon layer was deposited and doped n+to 30 ohm/sq. using a POCl$_3$ source. A 350 A thermal gate oxide was grown. Then a 1500 A layer of undoped LPCVD polysilicon was deposited by pyrolysis of SiH4 at 6200° C. Boron implantation was performed at various doses to adjust the channel doping. Device isolation was accomplished by complete island etch of channel polysilicon layer using a CHF3 based plasma. Source/drain regions were doped by boron implantation.

Two splits of slices were made which either did or did not receive grain boundary passivation by a plasma of hydrogen. The plasma was excited in an equal mixture of H2 and N2 by approximately 800 W of RF power at 13.56 MHz. The samples were held in the plasma at 3000° C. for a duration of 60 minutes.

Figure 8A:
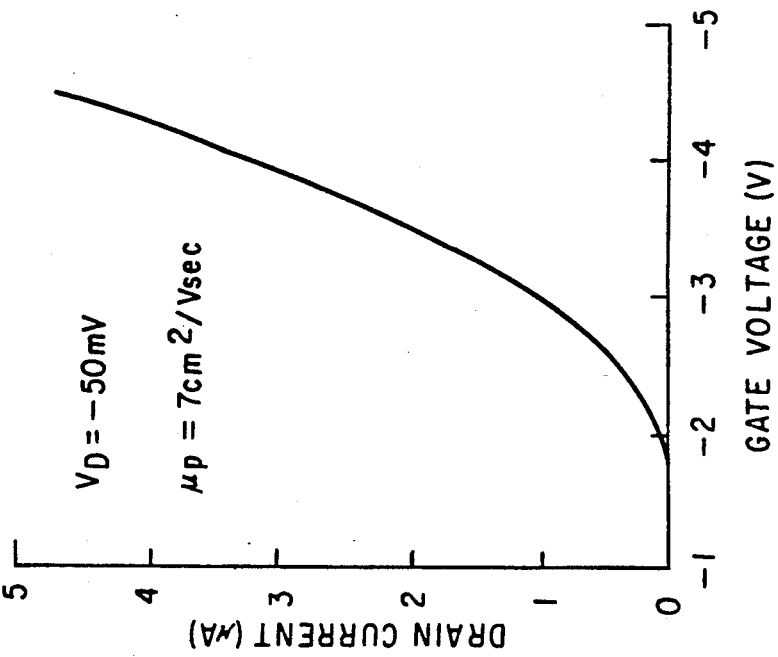
FIGS. 8a-b shows the effect of hydrogen passivation on the drain current versus gate voltage characteristics of a sample device according to the present invention.
Figure 8B:
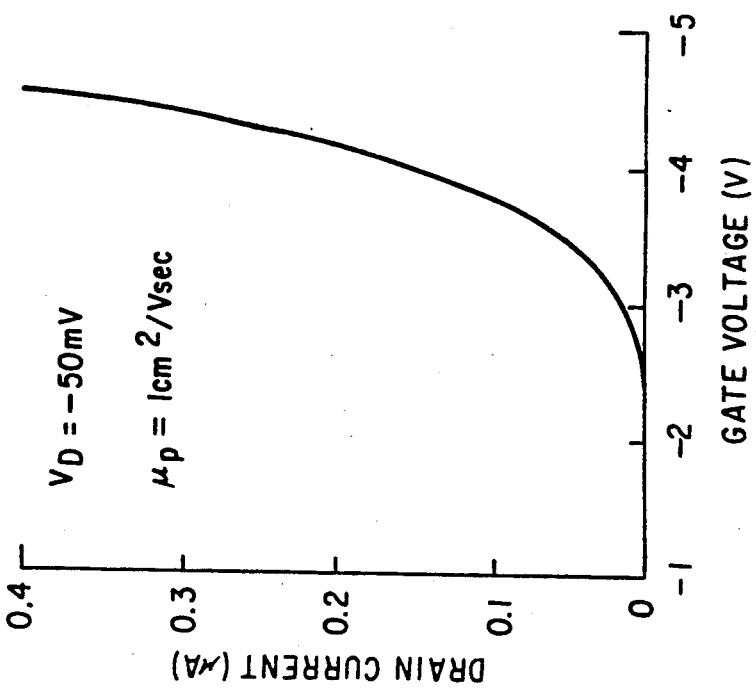
Figure 10:
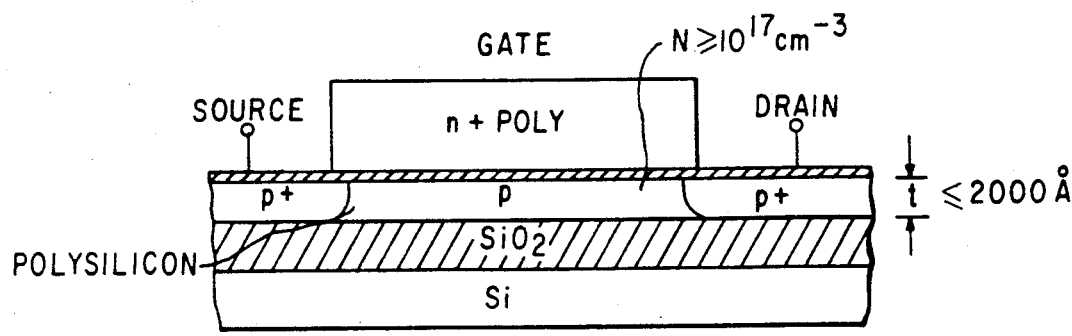
FIG. 10 shows a further sample embodiment of the invention.

The output characteristics of a first sample device L153/SO4 are shown in FIG. 7a. This device has an effective electrical channel width W=127 microns and electrical channel length L=1.5 microns. No hydrogen passivation treatment was carried out on this device. A well behaved MOSFET action is obtained, which is reproducible across the slice and from slice to slice. The drive current, measured at VD=VG=−5 V, is about 10 microamp. The accumulation hole mobility in the vicinity of VG=−5 V, as determined from the linear region transfer curve shown in FIG. 8a, is found to be about 1 cm2/V-sec. FIGS. 7b and 8b show the output characteristics for a second sample device according to the present invention, L153/S10. The physical parameters for this device are identical to that of L153/S04. The two devices were fabricated with similar processing schedule except that only L153/S10 saw the hydrogen plasma treatment. The drive current for this device is about 200 micro Amp, which is a factor of 20 higher than that of the unpassivated device. The corresponding hole mobility is found to be 7 cm2/V-sec Polycrystalline silicon is composed of small grains with random orientation separated by grain boundaries. Electrically active traps in the boundary region capture carriers and deplete the surrounding regions, giving rise to a potential barrier. These potential barriers have a significant effect on the conduction behaviour of a MOSFET. The observed increase in driving current after hydrogenation is partly related to the lowering of intergrain potential barrier, a phenomenon well documented in regard to polycrystalline semiconductor materials. Atomic hydrogen penetrates polysilicon during plasma treatment, saturating the dangling bonds at grain boundaries, thereby reducing the trap density.

FIG. 2a shows the effect of hydrogen passivation on space charges at grain boundaries schematically. Where hydrogen passivation is introduced, as in FIG. 2b, the trap density $q_{gb}$ at the grain boundary is dramatically reduced, since many of the dangling bonds are now bonded to hydrogen ions, producing electrically neutral sites. This in turn produces a strong reduction in the potential barrier $phi_{gb}$, which varies as the square of the interface charge density $q_{gb}$.

The subthreshold behaviour of these devices resembles the weak inversion characteristics of bulk silicon MOS transistors. However, the mechanism of origin of subthreshold characteristics in these devices is quite distinct from that of inversion mode bulk MOSFETs. At large gate drives the conduction in these devices is predominantly accumulation mode. With small gate bias, the current is largely supported by acceptor doping in the channel polysilicon layer. It is the gate modulation of this portion of device current that gives rise to the observed turn off property. On lowering the gate voltage, the channel polysilicon layer eventually becomes completely depleted. The current flow is now space charge limited over the potential barrier at the source end resulting in an exponential drain current dependence on gate bias.

The plasma hydrogen passivation reduces the generation/recombination centers in the channel poly, significantly improving the leakage current. The improvement in subthreshold slope, dramatically apparent in FIGS. 9a-9f, seems to be related to the reduction in electrically active surface states residing at the gate oxide-channel poly interface.

The spread in electrical parameters across the slices remains largely unaltered before and after passivation. For a majority of the tested devices the drive current is within +15% and the leakage current is within +50% of the mean values. It must be mentioned that contact photolithography was used to pattern the source drain separation and may be mainly responsible for the observed spread in drive current.

The hydrogen annealing is preferably performed by exposing the polysilicon to a hydrogen plasma, e.g. in a standard parallel-plate plasma reactor. For example, an anneal in a plasma discharge at a partial pressure of molecular hydrogen of 1000 microns for 60 minutes for a four inch wafer at a temperature in the neighborhood of 3000° C. is sufficient. However, this process debt is not at all end point sensitive. The hydrogen is introduced very rapidly, and simply serves to saturate the dangling bonds at the grain boundaries. An excess of hydrogen is innocuous.

Thus, the transistors of the present invention are preferably made using hydrogen-annealed polysilicon, although the hydrogen annealing step is not strictly necessary.

However, it should be noted that the hydrogen anneal preferably used is an atomic hydrogen anneal and not a molecular hydrogen anneal. That is, the plasma dissociates the H2 feed gas into species such as H+ ions and monotomic hydrogen free radicals, which are more easily linked with the dangling bonds at the grain boundary sites.

The hydrogen will also pass easily through a reasonably thin oxide cap (e.g. 7000 Angstroms). However, a thick nitride cap will retard the in-diffusion of the hydrogen significantly.

It should also be noted that prolonged high temperature processing steps subsequent to the hydrogen anneal should be avoided. If prolonged high temperature steps are subsequently used, the danger is that the atomic hydrogen which is passivated in the grain boundaries will recombine and out diffuse as molecular hydrogen. This means that the benefits of passivation at grain boundaries will gradually be lost, and the space charge barriers will gradually increase, degrading mobility and leakage. However, this is a gradual degredation rather than a catastrophic one, and a moderate amount of high-temperature steps can be tolerated. For example, an hour at 450° C., under the hydrogen and the only conditions noted above, can be tolerated easily. Longer high-temperature steps can also be tolerated, although it is preferable to minimize the subsequent high-temperature time where this can conveniently be done. For example, it is preferred to use a low-temperature multilevel oxide planarization step, rather than the conventional high-temperature PSF reflow. The presently preferred embodiment of this is to use OCD spin-on silicate solutions, which are then baked at low temperature to evaporate the organic solvent. However, a variety of other low-temperature MLO planarization methods can be used, including MLO reflow by transient heating (e.g. by laser annealing), or use of other low-temperature MLO materials, such as BPSG, lead-doped silica glasses, or organics such as polyimid or PIQ.

It should also be noted that, in the presently preferred embodiment, the contact sintering times and temperatures are slightly reduced. That is, LOM doped with 1% silicon is preferably centered in hydrogen for ten minutes at 400o It should be noted that the effects of hydrogen escape during subsequent high-temperature processing steps can be somewhat mitigated by performing the initial hydrogen passivation anneal for longer time and/or a higher partial pressure of hydrogen.

It should also be noted that hydrogen is not the only passivating species which can be used, although it is presently preferred. Fluorine can also be used, and it is believed that other halogen elements are also useful.

Alternatively, hydrogen ions could be implanted for grain boundary passivation, but this is certainly not a preferred embodiment.

It should also be noted that the present invention is not only applicable to insulated gate field effect transistors, but could also be applied to junction field effect transistors having a polysilicon gate. However, the insulated gate embodiment of the present invention is definitely preferred. In particular, the fast and uneven diffusion of dopants characteristic of polysilicon means that diffusion across the silicon/polysilicon boundary is likely to induce undesirable spreading device characteristics.

The following references provide useful background information on t he characteristics of polysilicon transistors, and are hereby incorporated by reference:

T. Ohzone, T. Hirao, K. Tsuji, S. Horiuchi, S. Takayangi, "2K×8 Bit Static RAM," IEDM Technical Digest, pp. 360-363, 1978.

This article teaches use of an accumulation-mode p-channel polysilicon transistor, where polysilicon channel layer is 5000 Angstroms thick and no hydrogen passivation is used.

K Ochii, K. Hashimoto, H. Yasuda, M. Masuda, T. Kondo, H. Nozawa and S. Kohyama, "An Ultralow Power 8K×8-Bit full CMOS RAM with a Six-Transistor Cell." IEEE J. Solid State Circ., SC-17, pp. 798-803, 1982.

Y. Uchida, T. Iizuka, J. Matsunaga, M. Isobe, S. Konishi, M. Sekine, T. Ohtani, and S. Kohyama, "A Low Power Resistive Load 64 Kbit CMOS RAM," IEEE J. Solid State Circ., SC-17, pp. 804-809, 1982

T. C. May and M. H. Woods, "Alpha-Particle-Induced Soft Errors in Dynamic Memories," IEEE Trans. Electron Devices, ED-26, pp. 2-9, 1979.

J. F. Gibbons and K. Lee, "A One-Gate-Wide CMOS Inverter." Electron Device Letters, ELD-1, pp. 117-118, 1980.

J. P. Colinge, E. Demoulin and M. Lobet, "Stacked Transistors CMOS (ST-MOS), an NMOS Technology Modified to CMOS," IEEE Trans. Electron Devices, ED-29, pp. 585-589, 1982.

T. Iizuka, H. Nozawa, Y Mizutani, H. Koneko and S. Kohyama, "Variable Resistance Polysilicon for High Density CMOS RAM," IEDM Technical Digest, pp. 370-373, 1979.

J. Y. W. Seto, "The Electrical Properties of Polycrystalline Silicon Films," J. App. Phy., Vol. 46, pp. 5247-5254, 1975.

Thus, the present invention teaches a polysilicon transistor which is different from the polysilicon transistors heretofore known in three important was:
1. the channel regions is thin;
2. the channel region is highly doped;
3. the channel region has the same doping type as the polysilicon source and drain regions, i.e. the transistor is operated in accumulation mode;
4. the transistor is passivated in hydrogen.

The use of high doping levels in the channel (preferably $5 \times 10^{16}$ per cubic centimeter or greater) produces two clearly desirable results: the threshold voltage is decreased. As extensively discussed above, high threshold voltages have been a crucial stumbling block to use of prior art polysilicon channel transistors. Secondly, the drain current is substantially increased. Third, the depletion depth $x_d$, i.e. the depletion depth corresponding to the built in Fermi potential, is decreased.

A crucial teaching of the present invention is that the polysilicon channel layer must be thin enough that it is depleted through, that is t is equal to or less than $x_d + x_b$, where $x_b$ is the backside depletion depth caused by the fixed charge typically found at the polysilicon/silicon dioxide backside interface. (This fixed charge will typically produce a depletion depth of about 1000 Angstroms at a poly doping level of $10^{17}$ per cubic centimeter.)

The use of a thin channel means that a heavily doped accumulation mode channel can be used while achieving good turn off characteristics. Thus, the present invention is the first to achieve the combination of good threshold voltage, good on-state series resistance, and good turn-off characteristics (low leakage).

A further advantage of the use of a thin polysilicon layer for channel regions is topographic. That is, a 1500 Angstrom layer of polysilicon, as used for transistors according to the present invention, will produce fewer step coverage problems in subsequent layers than will the thicker polysilicon layers typically used in the prior art.

FIGS. 4, 5, 6, 10, and 11 show a few of of the many device embodiments in which the present invention can be configured. As is obvious to those skilled in the art, the present invention provides a fundamentally new device structure, which can be embodied in a tremendous variety of integrated circuits, and which solves a huge variety of circuit designer's problems.

In addition, the key teaching of thin channel regions with high doping can be embodied in a wide variety of specific thicknesses and channel doping levels. For example, channel thicknesses of less than 3500 Angstroms, at channel doping levels of at least 5e16 ($5 \times 10^{16}$) per cubic centimeter, are within the scope of a first embodiment of the present invention. Additionally, polysilicon transistors having channel thicknesses of 2000 Angstroms or less at channel doping of at least $10^{17}$, are also within the scope of the present invention. In general, the accumulation mode polysilicon device having a mobility of at least five centimeters square per volt second, and a channel thickness of 2000 Angstroms or less, is also within the scope of the present invention.

A further advantage of the use of thin polysilicon transistors according to the present invention, in some applications, is that the spontaneous growth in grain size is limited. That is, for VLSI applications MOSFETS having channel lengths on the order of one or two microns are required. The grain size of as-deposited polysilicon will typically be in the range of 300 to 500

Angstroms, so that the number of grain boundaries cutting across the electrically shortest channel length will be reasonably large, e.g. 20 or more, and the variation in the numbers of grain boundaries cutting the channel regions of a particular device will cause only a moderate spread in device characteristics. However, if the grain size of the polysilicon spontaneously increases during processing, which it is likely to do, the average number of grain boundaries which lie across the electrically minimal channel is likely to decrease, which means that a much larger spread in device characteristics is likely to result. That is, if the polysilicon grain size spontaneously increases to near one micron, due to high-temperature steps during device processing, as is likely to happen, some devices will have no grain boundaries cutting the channel, some will have one, and some may have two or more. To the extent that the space charge barriers at grain boundaries can be reduced, this source of device characteristics spread becomes less important, as discussed above regarding the hydrogen passivation step. However, since present art does not entirely eliminate the effects of the grain boundaries, it is desirable to minimize the spread in device characteristics which results from the electrical effects of the grain boundaries. In this respect, the use of a thin polysilicon layer is helpful, since polysilicon thicknesses of 2000 Angstroms or less retard the increase in grain size which would otherwise occur spontaneously during processing.

Thus the present invention advantageously provides a polysilicon transistor having low leakage and low series resistance.

Figure 11:
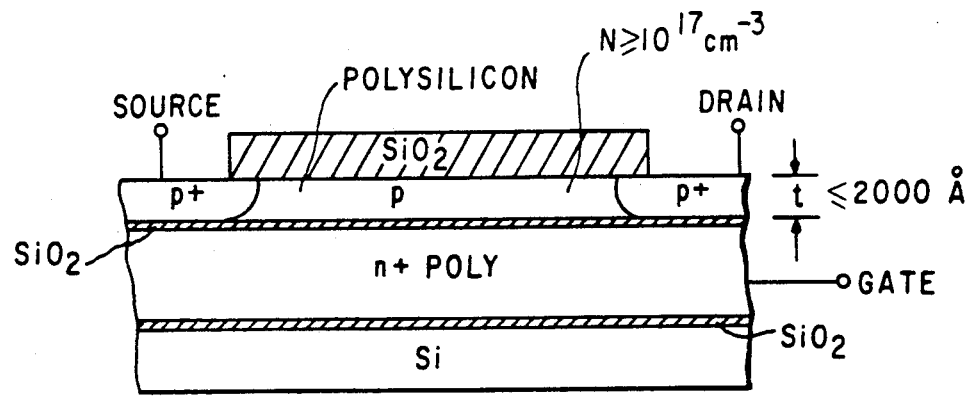
FIG. 11 shows a further embodiment of the invention in a vertically integrated structure.

Of course, transistors fabricated according to the present invention can be used in a wide variety of integrated circuit devices. For example, in addition to the silicon on insulator embodiments primarily discussed above, vertically integrated embodiments such as shown in FIG. 11 can also be used.

Moreover, silicon dioxide is not the only insulating substrate which can be used underneath a polysilicon transistor according to the present invention. A tremendous variety of other substrates can be used, such as sapphire, spinel silicate glasses, ceramics, etc.

Moreover, it should also be noted that the present invention is not specifically limited to a polycrystalline silicon transistor, although that is believed to be its primary application, but is also applicable to transistors formed in other polycrystalline semiconductor materials. The key teachings of the present invention in this respect are that the channel layers should be relatively thin and the channel doping levels should be relatively high and of the same type as the device on-state channel conductivity type. In embodiments using polysilicon, the channel thickness is preferably less than 3000 Angstroms, and the channel doping preferably greater than $10^{17}$ per cc. In applying the present invention to other semiconductors, the channel thickness can be adjusted in proportion to the square root of the permittivity of the semiconductor used. Similarly, the dopant concentration is preferably chosen merely to achieve a carrier concentration of greater than 5E16 in the particular semiconductor used.

As will be obvious to those skilled in the art, the present invention teaches a fundamental new device structure which can be used in a wide variety of integrated circuit device designs. Thus, not only can the foregoing description be modified and varied in a very wide number of respects, but an extremely broad range of equivalents is expressly asserted for the present invention, which is not limited except as specified in the following claims.

What is claimed is:

1. A polycrystalline-channel field effect transistor comprising:
    a channel region consisting essentially of polycrystalline silicon doped to have an equilibrium carrier concentration of at least $5 \times 10^{16}$ per cubic centimeter and also comprising a significant admixture of a grain-boundary-passivating species;
    source and drain regions connected to said channel region and having the same conductivity type as said channel region;
    said channel region being bounded at a first surface thereof by a gate which is capacitatively coupled through a dielectric to said channel region, and said channel region being bounded at a second surface thereof opposite to said first surface by a backside interface;
    wherein said channel consists predominantly of polysilicon, and wherein said channel is bounded at said first and second surfaces thereof by a dielectric predominantly comprising silicon dioxides;
    wherein said first surface has interface characteristics such as to deplete said channel to a first depth inward from said first surface,
    and said second surface has interface characteristics such as to deplete said channel to a second depth inward from said second surface,
    and the sum of said first and second depths is greater than the minimum thickness of said channel region,
    whereby said transistor is not conductive under zero applied gate voltage.

2. The transistor of claim 1, wherein said gate is heavily doped N-type polysilicon and said channel is P-type polysilicon.

3. The transistor of claim 1, wherein said passivating species consists essentially of hydrogen.

4. A polycrystalline-channel field effect transistor comprising:
    a channel region comprising a polycrystalline semiconductor material doped to have an equilibrium carrier concentration of at least $5 \times 10^{16}$ per cubic centimeter;
    source and drain-regions connected to said channel region and having the same conductivity type as said channel region;
    said channel region being bounded at a first surface thereof by a gate which is capacitatively coupled to said channel region, and said channel region being bounded at a second surface thereof opposite to said first surface by a backside interface,
    wherein said first surface has interface characteristics such as to deplete said channel to a first depth inward from said first surface,
    and said second surface has interface characteristics such as to deplete said channel to a second depth inward from said second surface,
    and the sum of said first and second depths is greater than the minimum thickness of said channel region,
    whereby said transistor is not conductive under zero applied gate voltage.

5. A polycrystalline-channel field effect transistor comprising:
    a channel region comprising polycrystalline semiconductor material;

source and drain regions connected to said channel region; and a gate positioned to apply an electric field to said channel region between said source and drain regions;

wherein said channel has an equilibrium carrier concentration of at least $5 \times 10^{16}$ per cubic centimeter, and is of the same conductivity type as said source and drain regions;

wherein said channel is sufficiently thin to be depleted at zero applied gate voltage.

* * * * *